United States Patent
Lee et al.

(10) Patent No.: US 9,098,757 B2
(45) Date of Patent: Aug. 4, 2015

(54) METHOD AND APPARATUS OF RFID TAG CONTACTLESS TESTING

(71) Applicant: Taiwan Semiconductor Manufacturing Company, Ltd., Hsin-Chu (TW)

(72) Inventors: Tsung-Hsiung Lee, New Taipei (TW); Kuang-Kai Yen, Kaohsiung (TW); Shi-Hung Wang, Houli Township (TW); Yung-Hsu Chuang, Hsinchu (TW); Huan-Neng Chen, Taichung (TW); Wei-Li Chen, Hsin-Chu (TW); Shih-Hung Lan, Jhubei (TW); Yi-Hsuan Liu, Hualien (TW); Fan-Ming Kuo, Zhubei (TW); Hsieh-Hung Hsieh, Taipei (TW); Chewn-Pu Jou, Hsin-Chu (TW); Fu-Lung Hsueh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 112 days.

(21) Appl. No.: 13/926,596

(22) Filed: Jun. 25, 2013

(65) Prior Publication Data
US 2014/0145749 A1 May 29, 2014

Related U.S. Application Data

(60) Provisional application No. 61/731,106, filed on Nov. 29, 2012.

(51) Int. Cl.
| | |
|---|---|
| *G01R 31/26* | (2014.01) |
| *G06K 7/00* | (2006.01) |
| *G01R 31/265* | (2006.01) |
| *G01R 31/302* | (2006.01) |

(52) U.S. Cl.
CPC .......... *G06K 7/0095* (2013.01); *G01R 31/2656* (2013.01); *G01R 31/3025* (2013.01)

(58) Field of Classification Search
None
See application file for complete search history.

(56) References Cited

U.S. PATENT DOCUMENTS

| | | | | |
|---|---|---|---|---|
| 7,307,528 | B2 * | 12/2007 | Glidden et al. | 340/572.1 |
| 7,472,296 | B2 * | 12/2008 | Kato et al. | 713/320 |

* cited by examiner

*Primary Examiner* — Minh N Tang
(74) *Attorney, Agent, or Firm* — Slater & Matsil, L.L.P.

(57) ABSTRACT

A semiconductor wafer includes a plurality of dies. Each of the plurality of dies includes a radio frequency identification (RFID) tag circuit and a coil. The RFID tag circuit includes a tag core, an RF front-end circuit, an ID decoder, a comparator and conductive line for a unique ID. The RF front-end circuit is configured to receive electromagnetic signals through the coil in each of the plurality of dies and to convert the received electromagnetic signals into commands. The ID decoder is configured to receive the commands and to generate an expect ID. The comparator is configured to compare the unique ID with the expect ID to generate a comparison result. The comparison result is arranged to decide if the tag core is configured to receive commands.

20 Claims, 5 Drawing Sheets

METHOD AND APPARATUS OF RFID TAG CONTACTLESS TESTING

This application claims priority to U.S. Provisional Application Ser. No. 61/731,106, filed on Nov. 29, 2012, entitled "Method and Apparatus of RFID Tag Contactless Testing," which application is hereby incorporated herein by reference.

FIELD OF DISCLOSURE

The present disclosure is related to radio frequency identification (RFID) and, more particularly, to RFID tag contactless testing.

BACKGROUND

A radio frequency identification (RFID) tag is a semiconductor die that can positively respond to a wireless signal sent by a "reader" and can verify its presence to the "reader".

Radio frequency identification (RFID) tags are used increasingly in a wide variety of applications. For example, RFID tags are used in conjunction with security-locks in cars, for access control to buildings, for tracking inventory and parcels, for automated transportation/distribution systems etc.

The RFID tags do not include a power source. In order to retrieve information from a chip, a "base station" or "reader" sends an excitation signal to an RFID tag. The excitation signal energizes the RFID tag and the RFID tag transmits the stored information back to the reader. The information may include environmental data, logistical histories, state data, etc. In general, RFID tags retain and transmit enough information to uniquely identify individuals, packages, inventory and the like.

One challenge associated with RFID tags is manufacturing and testing the RFID tags in a high-volume and cost-effective manner.

DETAILED DESCRIPTION

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

Some embodiments have one or a combination of the following features and/or advantages. A semiconductor wafer includes a plurality of RFID dies. A probe card includes an antenna or a coil. The probe card is configured to wirelessly test a group of RFID dies or each of the plurality of RFID dies individually. Each of the plurality of dies includes a radio frequency identification (RFID) tag circuit and a coil. The RFID tag circuit includes a tag core, an RF front-end circuit (sometimes referred to herein as an analog front end or AFE), an ID decoder and a comparator. The RFID tag circuit of each of the plurality of RFID dies further includes a unique ID such that one RFID die of the plurality of RFID dies is differentiable with other RFID dies. The coil is electrically connected to the AFE. The RF front-end circuit is configured to receive electromagnetic signals that are sent from the probe card through the coil in each of the plurality of dies and to convert the received electromagnetic signals into commands. The ID decoder is configured to receive the commands and to generate an expect ID. The comparator is configured to compare the unique ID with the expect ID to generate a comparison result. The comparison result is arranged to decide if the tag core is arranged to receive commands. The RFID die with tag core that receives the commands is configured to transmit a response back to the probe card, and the other RFID dies are arranged to not respond to the commands.

Figure 1:
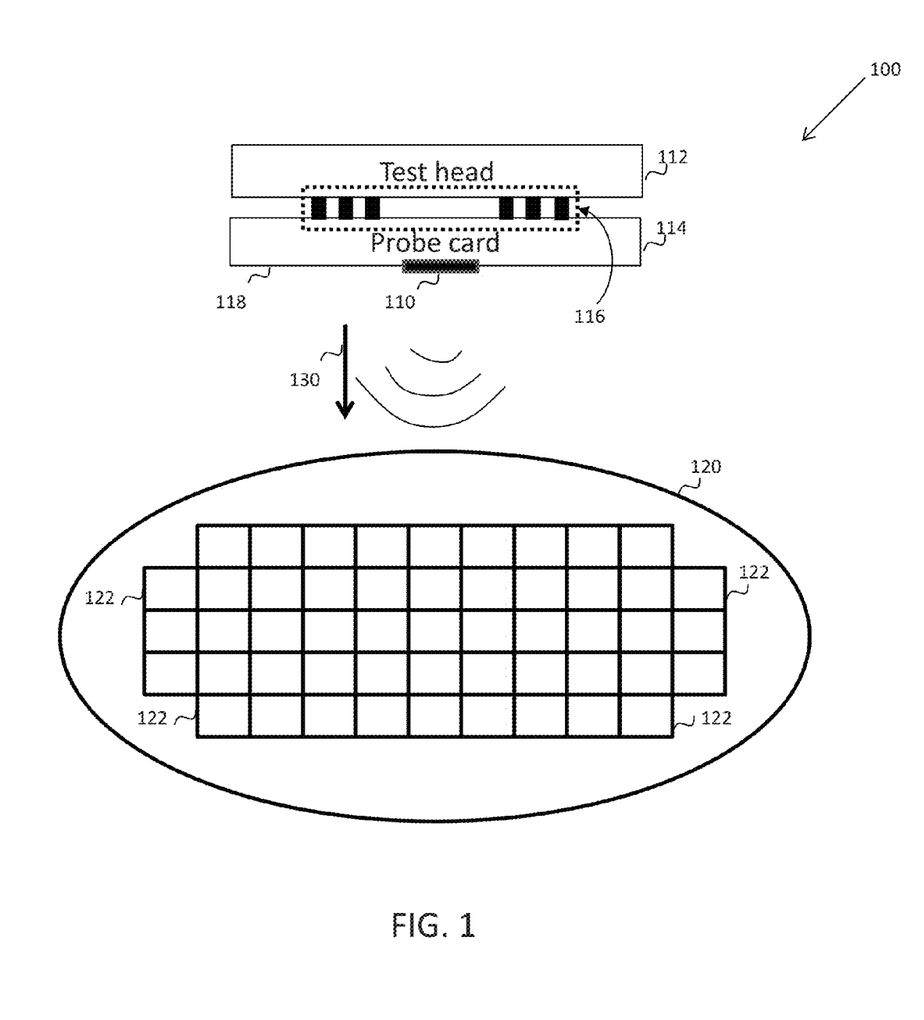
FIG. 1 is a system 100 of a contactless wafer testing of RFID tags in accordance with some embodiments.

FIG. 1 is a system 100 of a contactless wafer testing of RFID tags according to some example embodiments. The system 100 includes a test head 112 of a tester (not shown), a probe card 114, and a RFID wafer 120. The test head 112 is included in an automatic test equipment (ATE) system. It is advantageous to place as much electronic circuitry in the test head as possible to reduce signal propagation delays. For example, the test head generally contains massive volumes of electronic circuits and cabling, mechanical packaging, and cooling hardware necessary for testing integrated circuit wafers during and after manufacturing processes. The test head houses portions of the test system that, in some embodiments, are located as close as possible to the device under test (DUT), and connects to the tester body via one or more cables. A probe interface 116 is arranged to connect the test head 112 and the probe card 114.

The probe card 114 includes a corresponding antenna 110 on the surface 118 of the probe card 114. In some embodiments, a coil is used in place of the antenna. For simplicity, the term antenna and coil are used interchangeably hereafter and such use should not limit the scope of the claims appended herewith. In a wafer test, test patterns that are specified by users in the tester are configured to convert into separated corresponding control signals and data signals. The control signals and data signals are transmitted from the tester through the test head 112 and probe interface 116 to the probe card 114. The control signals and data signals are then configured to convert into corresponding electromagnetic signals 130 and are configured to propagate as radio frequency waves by the antennas or coils 110 on the surface 118 of the probe card 114.

The RFID wafer 120 includes a plurality of RFID dies 122. For illustration purposes, only four RFID dies 122 are labeled. Each of the plurality of RFID dies includes a coil and a RFID tag circuit (not shown). The RFID tag circuit receives the electromagnetic signals 130 through the coil of the corresponding RFID die. The RFID tag circuit then transmits a response containing requested data back to the probe card 114 through the coil of corresponding RFID die. In such a situation, the antenna 110 on the surface 118 of the probe card 114 is configured to communicate with each of the plurality of RFID dies 122 one by one.

Although only one antenna 110 on the surface 118 of the probe card 114 is shown, other numbers of antenna or coil are within the scope of various embodiments. For example, the surface 118 of the probe card 114 may include two antennas or coils, each of the two antennas or coils being arranged to communicate with half of the plurality of RFID dies 122 in the RFID wafer 120 respectively.

Scribe regions (not shown) are spaces in between the plurality of RFID dies 122 such that the RFID wafer 120 is cut into physically separated RFID dies 122 along the scribe region without damaging the RFID dies 122. In some embodiments, a saw is configured to cut the RFID wafer 120 into physically separated RFID dies 122. In some embodiments, the saw is a water-cooled circular saw with diamond-tipped teeth. In some embodiments, the RFID wafer 120 is cut into physically separated RFID dies 122 using chemical etching process. In some embodiments, the RFID wafer 120 is cut into physically separated RFID dies 122 using laser scribing.

Figure 2:
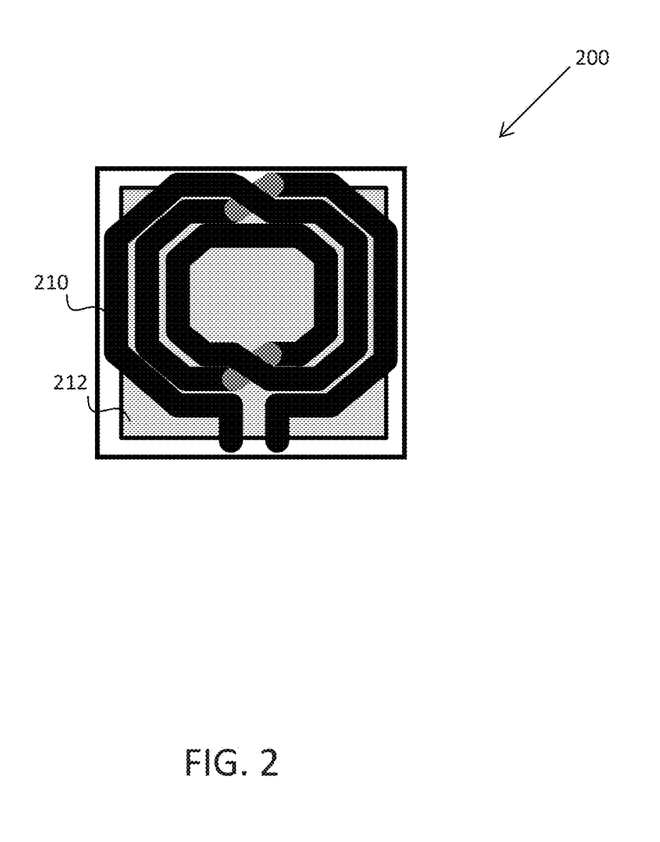
FIG. 2 is an enlarged plane view of an RFID die 200 to illustrate a schematic of the RFID die 122 in FIG. 1 in accordance with some embodiments.

FIG. 2 is an enlarged plane view of an RFID die 200 according to some example embodiments. The RFID die 200 is an embodiment of the RFID die 122 in FIG. 1. The RFID die 200 includes a coil 210 and an RFID tag circuit 212. The coil 210 is electrically connected to the RFID tag circuit 212; moreover, the coil 210 receives the electromagnetic signals 130 in FIG. 1 and transmits the signals to the RFID tag circuit 212.

In some embodiments, the coil 210 is wound into a circular pattern to serve as an antenna to make radio communications for the RFID tag circuit 212. In some embodiments, the coil 210 is formed by winding metal lines, oxide definition (OD), polysilicon (POLY), redistribution layer (RDL), or other conductive line.

In some embodiments, a dimension of the coil 210 is substantially equal to a dimension of the RFID die 122 of the RFID wafer 120 in FIG. 1. In some embodiments, a dimension of the coil 210 is substantially larger than a dimension of the RFID die 122 of the RFID wafer 120 in FIG. 1. In such a situation, a portion of conductive line in the coil 210 is arranged to lie on scribe regions such that the conductive lines of the coil 210 are broken into segments after die sawing by cutting off the portion of conductive line in the coil 210. In some embodiments, a new antenna or coil (not shown) is arranged and electrically connected to the RFID tag circuit 212 for further functional operations.

Figure 3:
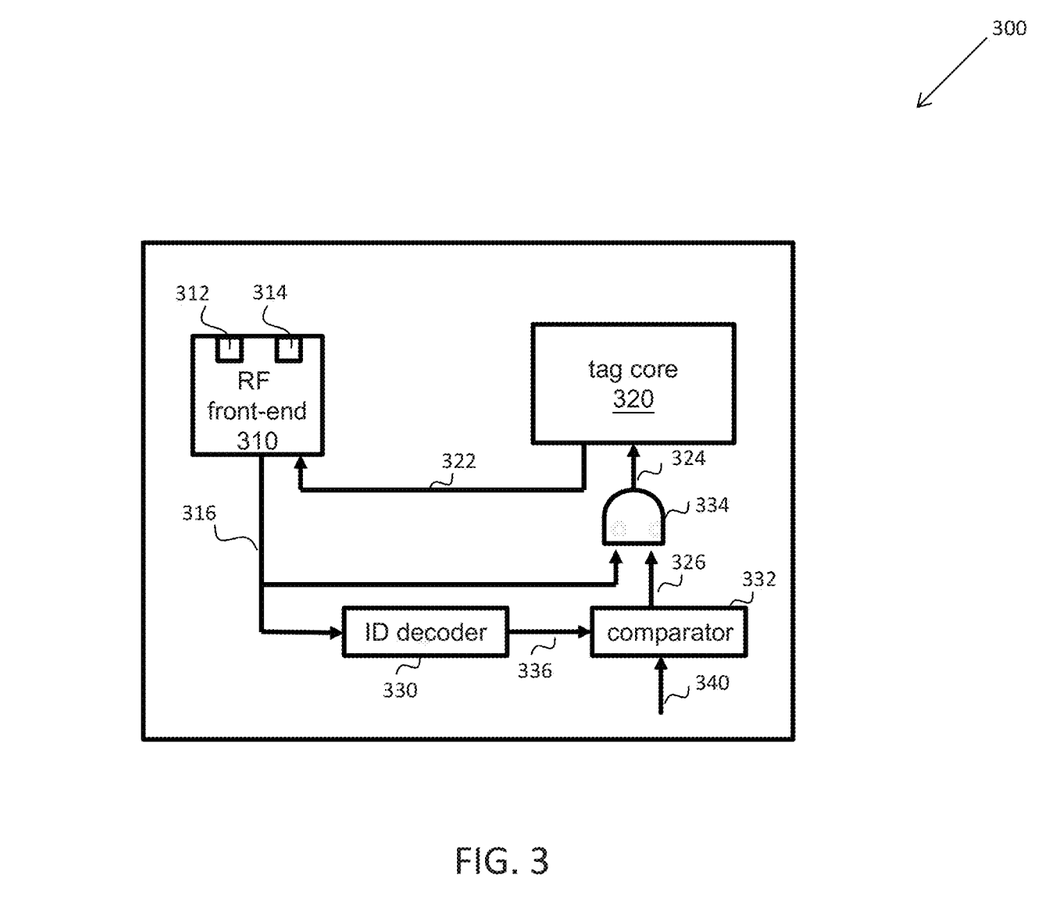
FIG. 3 is a schematic of a RFID tag circuit 300 to illustrate details of the RFID tag circuit 212 in FIG. 2 in accordance with some embodiments.

FIG. 3 is a schematic of a RFID tag circuit 300 to illustrate details of the RFID tag circuit 212 in FIG. 2 according to some example embodiments. The RFID tag circuit 300 includes an RF front-end circuit 310, an RFID tag core 320, an identification (ID) decoder 330, a comparator 332, an AND gate 334 and conductive lines 316, 322-326, 336, 340. In some embodiments, the RF front-end circuit is an analog front end (AFE). In some embodiments, the RF front-end circuit is a transceiver. The RF front-end circuit 310 is electrically connected through the conductive line 316 to the ID decoder 330 and an input of the AND gate 334. The ID decoder 330 is electrically connected through the conductive line 336 to the comparator 332. The comparator 332 receives a unique ID on the conductive line 340 and an expect ID on the conductive line 336. The comparator 332 then generates a compared result on the conductive line 326 and is electrically connected to another input of the AND gate 334. An output of the AND gate 334 is electrically connected through conductive line 324 to the RFID tag core 320. Output of the RFID tag core 320 is configured to transmit through the conductive line 322 to the RF front-end circuit 310.

The ports 312 and 314 of the RF front-end circuit 310 are arranged to connect to a coil such as the coil 210 in FIG. 2. In a wafer test, the RF front-end circuit 310 receives the electromagnetic signals 130 in FIG. 1 through the coil 210 in FIG. 2. The RF front-end circuit 310 then performs analog to digital conversion to convert the received electromagnetic signals 130 into serial digital data on the conductive line 316. In some embodiments, the serial digital data on the conductive line 316 include commands. In some embodiments, the serial digital data on the conductive line 316 include data such as expect ID. In some embodiments, after receiving the electromagnetic signals 130 in FIG. 1 through the coil 210 in FIG. 2, the RF front-end circuit 310 is configured to provide an operation voltage and a reference ground (not shown). The operation voltage and the reference ground are arranged to transmit to the rest of the circuits in the RFID tag circuit 300. For simplicity, the operation voltage and the reference ground from the RF front-end circuit 310 to the rest of the circuits in the RFID tag circuit 300 are not shown.

The ID decoder 330 receives the serial digital data on the conductive line 316, extracts the expect ID that is embedded in the serial digital data, then puts the expect ID on the conductive line 336. In some embodiments, the extracted expect ID stored in storage such as flip-flops such that the expect ID on the conductive line 336 is kept unchanged until the storage is overwritten again.

The comparator 332 is configured to compare the expect ID on the conductive line 336 and the unique ID on the conductive line 340, and then generates a signal of compared result on the conductive line 326. Each of the plurality of RFID dies in the RFID wafer 120 in FIG. 1 includes a unique ID such that one RFID die in the RFID wafer 120 is differentiable with other RFID dies. The signal of compared result is "1" when the expect ID is substantially equal to the unique ID, otherwise the signal of compared result is "0". When the signal of compared result is "0", the commands and data on the conductive line 316 are blocked by the AND gate 334 such that the commands and data on the conductive line 316 can not transmit to the RFID tag core 320. On the other hand, when the signal of compared result is "1", the commands and data on the conductive line 316 are arranged to transmit to the RFID tag core 320.

After executing the corresponding commands and data, the RFID tag core 320 is configured to generate results on the conductive line 322. The RF front-end circuit 310 then transmits the results on the conductive line 322 back to the probe card 114 in FIG. 1 through the coil connected to the ports 312 and 314. In such a situation, the ATE is configured to either send another command with the same expect ID to the same RFID die, or send commands with corresponding expect ID to another RFID die.

In some embodiments, the conductive line 340 is arranged to tie to the operation voltage or the reference ground in a layout stage to generate corresponding unique ID for each of the plurality of the RFID dies 122 in FIG. 1. In some embodiments, the operation voltage and the reference ground are provided by the RF front-end circuit 310 after receiving the electromagnetic signals 130 in FIG. 1. When a bit is tied to the operation voltage, the bit is represented as "1". When the bit is tied to ground, the bit is represented as "0". For example, the conductive line 340 includes four bits. Four bits of the conductive line 340 of first RFID die in the RFID wafer 120 in FIG. 1 are tied to "0, 0, 0, 1" respectively. On the other hand, four bits of the conductive line 340 of second RFID die in the RFID wafer 120 in FIG. 1 are tied to "0, 0, 1, 0" respectively. In such a situation, each of the plurality of RFID dies 122 in FIG. 1 has a unique ID such that one RFID die is differentiable from another RFID die.

Figure 4:
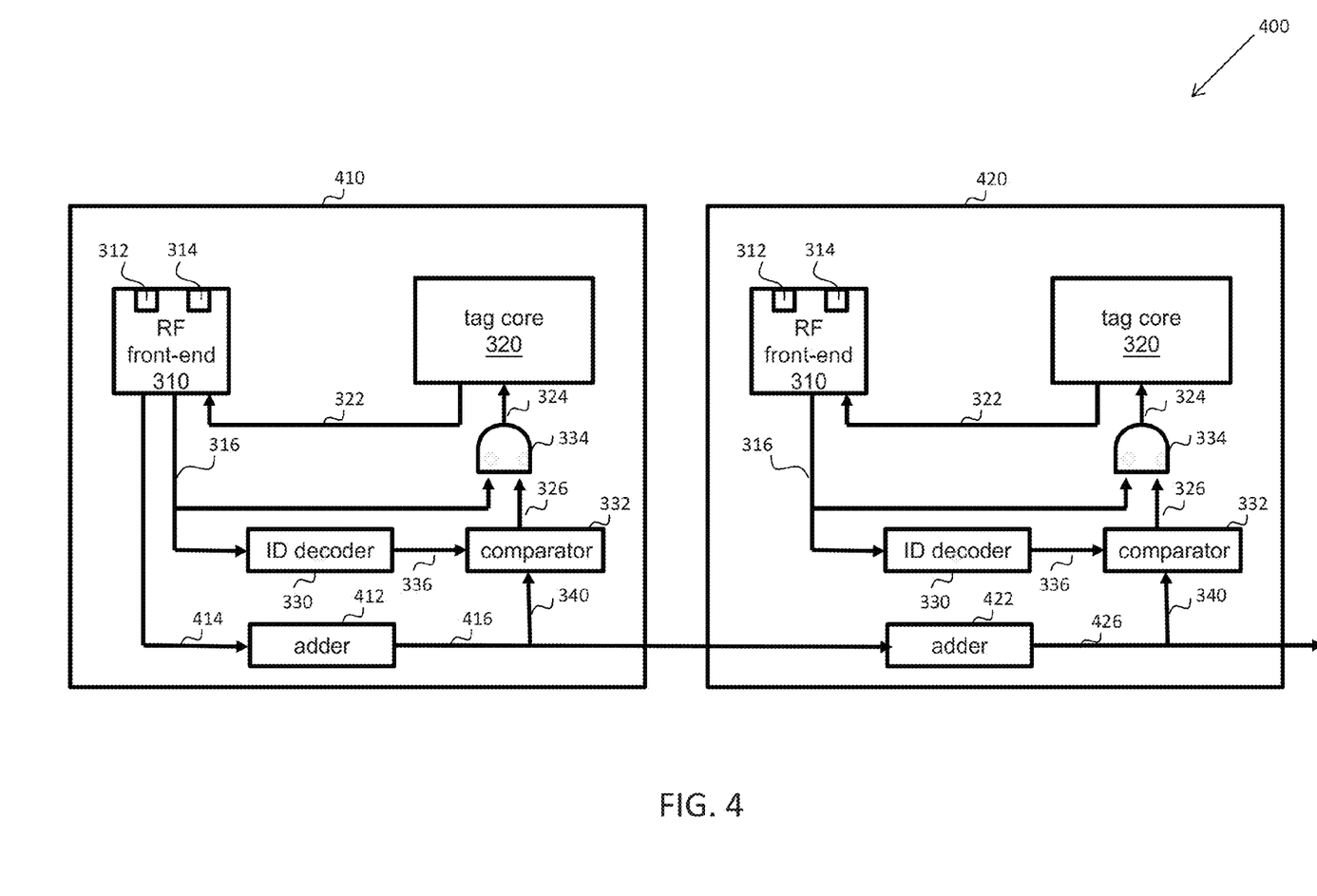
FIG. 4 is a schematic 400 to illustrate details of generating unique ID in accordance with some embodiments.

FIG. 4 is a schematic 400 to illustrate details of generating unique ID according to other example embodiments. The schematic 400 includes RFID tag circuits 410 and 420. Compared with the RFID tag circuit 300 in FIG. 3, the RFID tag circuit 410 includes similar elements except an adder 412 and conductive lines 414 and 416 that are additional elements to the RFID tag circuit 300 in FIG. 3. The conductive line 414 is arranged to connect to the operation voltage and/or the reference ground of the RF front-end circuit 310 of the RFID tag circuit 410 to form an initial ID. For example, the conductive line 414 includes four bits. Four bits of the conductive line 414 are connected to the reference ground provided by the RF front-end circuit 310 of the RFID tag circuit 410 such that the initial ID on conductive line 414 is "0, 0, 0, 0". The adder 412 receives the initial ID, and then outputs a unique ID that is equal to the initial ID plus one on the conductive line 416. In such a situation, the unique ID on the conductive line 416 is "0, 0, 0, 1".

Compared with the RFID tag circuit 300 in FIG. 3, the RFID tag circuit 420 includes similar elements except an adder 422 and conductive line 416 and 426 that are additional elements to the RFID tag circuit 300 in FIG. 3. The adder 422 receives the ID on the conductive line 416, and outputs a unique ID of RFID tag circuit 420 that is equal to the ID on the conductive line 416 plus one on the conductive line 426. For example, the adder 422 receives the ID "0, 0, 0, 1" on the conductive line 416, and then outputs a unique ID "0, 0, 1, 0" of RFID tag circuit 420 on the conductive line 426.

In some embodiments, one of the plurality of RFID dies 122 of the wafer 120 in FIG. 1 includes at least one RFID tag circuit that is similar to the RFID tag circuit 410 such that inputs of the adder 412 are tied to the operation voltage and/or the reference ground from the RF front-end circuit 310 of the RFID tag circuit 410. The rest of the plurality of RFID dies 122 of the wafer 120 in FIG. 1 includes RFID tag circuits that are similar to the RFID tag circuit 420 such that inputs of the adder 422 are arranged to connect to outputs of the adder 412 or 422 of RFID tag circuit in adjacent RFID die.

In some embodiments, the adders 412 and 422 in the RFID tag circuits 410 and 420, respectively, in FIG. 4 are replaced with some logic gates to generate respective corresponding unique ID for each of the plurality of RFID dies 122 of the RFID wafer 120 in FIG. 1 in different ways. In such a situation, the connectivity of the conductive line 414 of the RFID tag circuit 410 between the logic gates and the RF front-end circuit 310 are adjusted accordingly. For example, a subtracter is arranged to replace the adders 412 and 422 such that output of the subtracter is equal to input of the subtracter minus one. Four bits of the conductive line 414 are connected to the operation voltage provided by the RF front-end circuit 310 of the RFID tag circuit 410 such that the initial ID on the conductive line 414 is "1, 1, 1, 1". In such a configuration, unique ID on the conductive line 416 is "1, 1, 1, 0" and unique ID on the conductive line 426 is "1, 1, 0, 1".

Figure 5:
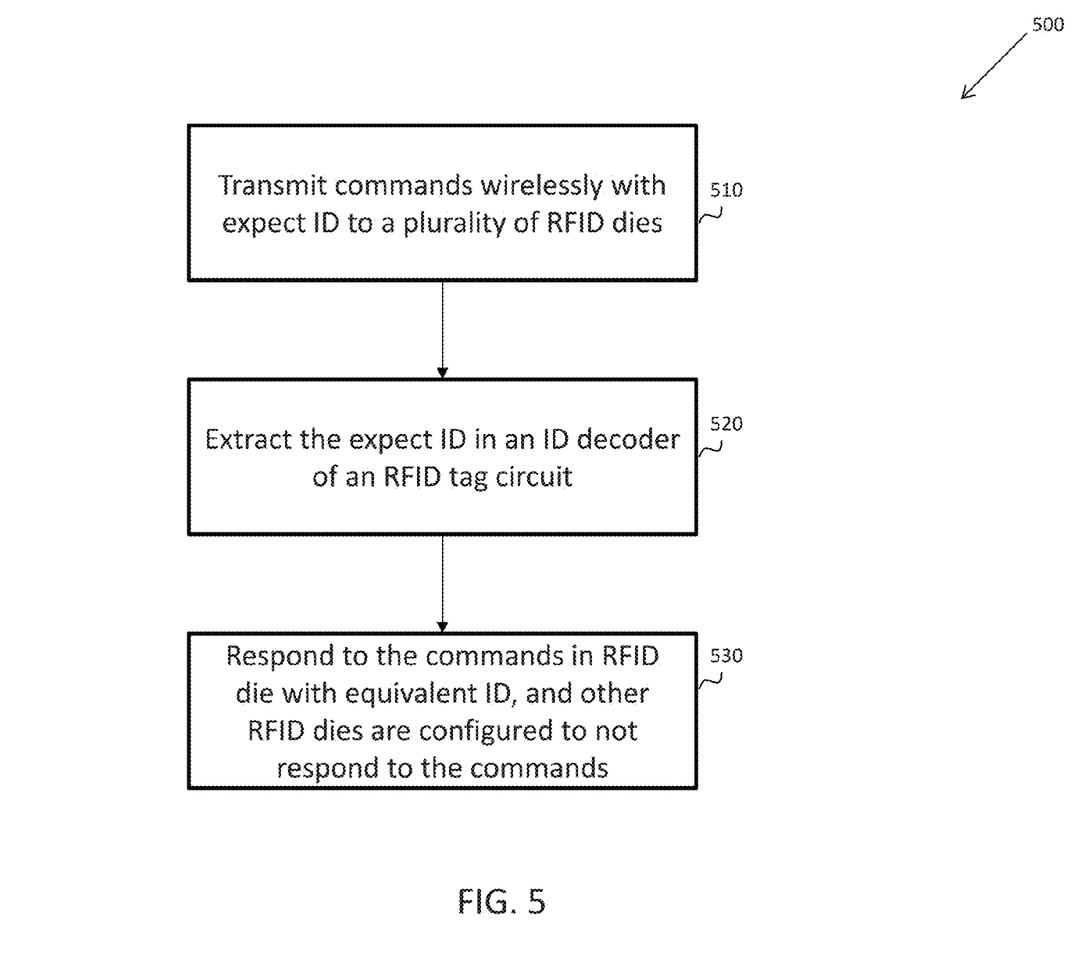
FIG. 5 illustrates a flow chart 500 of a contactless wafer testing method of RFID tags in FIG. 1 and FIG. 3 in accordance with some embodiments.

FIG. 5 illustrates a flow chart 500 of a contactless wafer testing method of RFID tags in FIG. 1 and FIG. 3 according to some example embodiments.

In step 510, commands with expect ID are configured to transmit to the plurality of RFID dies 122 of the RFID wafer 120 in FIG. 1. For example, in FIG. 1, test patterns with the expect ID that are specified by users in the tester are converted into separated corresponding control signals and data signals. In such a situation, data signals include commands and expect ID. The control signals and data signals are configured to transmit from the tester through the test head 112 and probe interface 118 to the probe card 114. The commands with expect ID are then configured to convert into corresponding electromagnetic signals 130 and are configured to propagate as radio frequency waves by the antennas or coils 110 on the surface 118 of the probe card 114 to the plurality of RFID dies 122 of the RFID wafer 120.

In some embodiments, in a wafer test, the probe card 114 is configured to propagate electromagnetic signals 130 containing commands and corresponding expect ID to each of the plurality of RFID dies 122 of the RFID wafer 120 in FIG. 1. In other embodiments, the probe card 114 is configured to propagate electromagnetic signals 130 containing commands and corresponding expect ID to a group of selected RFID dies in the plurality of RFID dies 122 of the RFID wafer 120 in FIG. 1. In such a situation, test results of the group of selected RFID dies are arranged to represent overall test results of the RFID wafer 120 in FIG. 1. The test time and cost for the group of selected RFID dies is less than the test time and cost of the plurality of RFID dies 122 of the RFID wafer 120 in FIG. 1.

In step 520, an ID decoder of an RFID tag circuit is configured to extract the expect ID after received the commands. For example, in FIG. 3, the RF front-end circuit 310 receives the electromagnetic signals 130 in FIG. 1 through the coil 210 in FIG. 2. The RF front-end circuit 310 then performs an analog to digital conversion to convert the received electromagnetic signals 130 into serial digital data on the conductive line 316. In such a situation, the serial digital data includes the commands with expect ID. The ID decoder 330 receives the serial digital data on the conductive line 316, extracts the expect ID that embedded in the serial digital data, then puts the expect ID on the conductive line 336.

In step 530, the RFID die with an equivalent ID is configured to respond to the commands, and other RFID dies are configured to not respond to the commands. For example, in FIG. 3, the comparator 332 compares the expect ID on the conductive line 336 and the unique ID on the conductive line 340, and then generates a signal of compared result on the conductive line 326. The signal of the compared result is "1" when the expect ID on the conductive line 336 is substantially equal to the unique ID on the conductive line 340. In such a situation, the corresponding RFID die has an equivalent ID that is compared to the expect ID. Otherwise the signal of the compared result is "0". When the signal of the compared result is "0", the commands and data on the conductive line 316 are blocked by the AND gate 334 such that the commands and data on the conductive line 316 are not transmitted to the RFID tag core 320. On the other hand, when the signal of the compared result is "1", the commands and data on the conductive line 316 are arranged to transmit to the RFID tag core 320.

After executing the corresponding commands and data, the RFID tag core 320 with an equivalent ID is configured to generate results on the conductive line 322. The RF front-end circuit 310 of the RFID tag circuit 320 with an equivalent ID then transmits the results on the conductive line 322 back to the probe card 114 in FIG. 1 through the coil that are connected to the ports 312 and 314. As each of the plurality of RFID dies has a unique ID, only one RFID die out of the plurality of RFID dies has an equivalent ID at a time and is configured to respond the commands. Other RFID dies are configured to not respond to the commands.

In some embodiments, a semiconductor wafer includes a plurality of dies. Each of the plurality of dies includes a radio frequency identification (RFID) tag circuit and a coil. The RFID tag circuit includes a tag core, a first circuit, an ID decoder, a comparator and conductive line for a unique ID. The first circuit is configured to receive electromagnetic signals through the coil in each of the plurality of dies and to convert the received electromagnetic signals into commands. The ID decoder is configured to receive the commands and to generate an expect ID. The comparator is configured to compare the unique ID with the expect ID to generate a comparison result. The comparison result is used in deciding if the tag core is configured to receive the commands.

In some embodiments, a system for testing radio frequency identification (RFID) tags includes a probe card and a wafer. The probe card includes an antenna. A wafer includes a plurality of dies. Each of the plurality of dies includes a radio frequency identification (RFID) tag circuit and a coil. The RFID tag circuit includes a tag core, a first circuit, an ID decoder, a comparator and conductive line for a unique ID. The probe card is configured to send electromagnetic signals through the antenna on the probe card. The first circuit is configured to receive the electromagnetic signals through the coil in each of the plurality of dies and to convert the received electromagnetic signals into commands. The ID decoder is configured to receive the commands and to generate an expect ID. The comparator is configured to compare the unique ID with the expect ID to generate a comparison result. The comparison result is used in deciding if the tag core is configured to receive commands.

In some embodiments, a method of configuring a wafer testing of radio frequency identification (RFID) tags includes transmitting commands wirelessly with an expect ID to a plurality of RFID dies. The method also includes extracting the expect ID in an ID decoder of an RFID tag circuit in each of the plurality of RFID dies. The method further includes responding to the commands in a RFID die with an equivalent ID, and other RFID dies are configured to not respond to the commands.

While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. A semiconductor wafer, comprising:
   a plurality of dies, each of the plurality of dies including a radio frequency identification (RFID) tag circuit and a coil; and
   each RFID tag circuit further including a tag core, a first circuit, an ID decoder, a comparator and conductive line for a unique ID;
   wherein
      the first circuit is configured to receive electromagnetic signals through a respective coil and to convert the received electromagnetic signals into a command;
      the ID decoder is configured to receive the commands and to generate an expect ID; and
      the comparator is configured to compare the unique ID with the expect ID to generate a comparison result; and
      the comparison result is used in deciding if the tag core is configured to receive the commands.

2. The semiconductor wafer of claim 1, wherein the conductive lines for the unique ID is selectively electrically connected to one of an operation voltage and a reference ground, provided by the first circuit, to form the unique ID.

3. The semiconductor wafer of claim 1, wherein
   the RFID tag circuit further including logic gates; and
   the conductive lines for the unique ID are electrically connected to respective outputs of the logic gates to form the unique ID.

4. The semiconductor wafer of claim 3, wherein respective inputs of the logic gates of the RFID tag circuit of at least one of the plurality of dies are electrically connected to one of an operation voltage and a reference ground provided by respective first circuit; and
   Respective inputs of the logic gates of the RFID tag circuit of the rest of the plurality of dies are electrically connected to respective outputs of the logic gates of the RFID tag circuit of an adjacent RFID die.

5. The semiconductor wafer of claim 1, wherein a dimension of the coil is substantially larger than a dimension of a respective die of the plurality of dies.

6. The semiconductor wafer of claim 5, wherein conductive lines of the coil are arranged to lie on scribe regions between adjacent dies of the plurality of dies.

7. The semiconductor wafer of claim 1, further including a storage device configured to store the expect ID generated by the ID decoder.

8. A system for testing radio frequency identification (RFID) tags, comprising:
   a probe card including an antenna; and
   a wafer comprising
      a plurality of dies, each of the plurality of dies including a RFID tag circuit and a coil; and
      each RFID tag circuit including a tag core, a first circuit, an ID decoder, a comparator and conductive lines for transmitting a unique ID;
   wherein for each die of the plurality of dies
      the probe card is configured to send electromagnetic signals through the antenna on the probe card;
      the first circuit is configured to receive the electromagnetic signals through a respective coil and to convert the received electromagnetic signals into a command;
      the ID decoder is configured to receive the command and to generate an expect ID;
      the comparator is configured to compare the unique ID with the expect ID to generate a comparison result; and
      the comparison result is used in deciding if the respective tag core is configured to receive commands.

9. The system of claim 8, wherein the respective conductive lines for transmitting the respective unique ID are selectively electrically connected to one of an operation voltage and a reference ground provided by the respective first circuit to form the respective unique ID.

10. The system of claim 8, wherein
    the respective RFID tag circuit further includes logic gates; and
    the respective conductive lines for the unique ID are electrically connected to respective outputs of the logic gates to form the respective unique ID.

11. The system of claim 10, wherein respective inputs of the logic gates of the RFID tag circuit of at least one of the plurality of dies are selectively electrically connected to one of an operation voltage and a reference ground provided by the respective first circuit; and
    Respective inputs of the logic gates of the RFID tag circuit of the rest of the plurality of dies are electrically connected to respective outputs of the logic gates of the RFID tag circuit of an adjacent RFID die.

12. The system of claim 8, wherein a dimension of a respective coil is substantially larger than a dimension of a respective die of the plurality of dies.

13. The system of claim 12, wherein conductive lines of the coil are arranged to lie on scribe regions between adjacent dies of the plurality of dies.

14. The system of claim 8, wherein a dimension of a respective coil is substantially equal to a dimension of a respective die of the plurality of dies.

15. A method of configuring a wafer testing of radio frequency identification (RFID) tags, comprising:
- transmitting commands wirelessly with an expect ID to a plurality of RFID dies;
- extracting the expect ID in an ID decoder of an RFID tag circuit in each of the plurality of RFID dies; and
- responding to the commands in a RFID die with an equivalent ID, and not responding to the command in RFID dies not having the equivalent ID.

16. The method of claim 15, wherein each of the plurality of RFID dies includes a unique ID;
- and further comprising comparing the unique ID with the respective expect ID to decide if corresponding RFID die has the equivalent ID.

17. The method of claim 15, wherein the commands with the expect ID are wirelessly transmitted from an antenna in a probe card to the plurality of RFID dies.

18. The method of claim 17, wherein the RFID die with the equivalent ID generates execution results and responds with the execution results to the probe card.

19. The method of claim 17, further comprising arranging test results of a group of selected RFID dies among the plurality of RFID dies to represent test results of a RFID wafer that includes the plurality of RFID dies.

20. The method of claim 15, wherein each of the plurality of RFID dies includes a coil having a dimension substantially larger a dimension of a respective die.

* * * * *